(12) United States Patent
Collins et al.

(10) Patent No.: US 10,218,376 B1
(45) Date of Patent: Feb. 26, 2019

(54) CAPACITIVE DIGITAL-TO-ANALOG CONVERTER

(71) Applicant: Xilinx, Inc., San Jose, CA (US)

(72) Inventors: Diarmuid Collins, Dunshaughlin (IE); Bruno Miguel Vaz, Sao Domingos de Rana (PT)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/807,482

(22) Filed: Nov. 8, 2017

(51) Int. Cl.
*H03M 1/46* (2006.01)
*H03M 1/66* (2006.01)

(52) U.S. Cl.
CPC ........... *H03M 1/466* (2013.01); *H03M 1/462* (2013.01); *H03M 1/66* (2013.01)

(58) Field of Classification Search
CPC ......... H03M 1/466; H03M 1/66; H03M 1/462
USPC ........................................ 341/131, 144, 150
See application file for complete search history.

(56) References Cited

U.S. PATENT DOCUMENTS

| | | | |
|---|---|---|---|
| 6,489,905 B1 | 12/2002 | Lee et al. | |
| 7,148,758 B1 | 12/2006 | Ross et al. | |
| 7,830,986 B1 | 11/2010 | Gaither | |
| 8,890,730 B2 | 11/2014 | Lowney et al. | |
| 8,922,412 B1 | 12/2014 | Gorman et al. | |
| 9,048,860 B1 | 6/2015 | Quinn | |
| 9,362,939 B1* | 6/2016 | Rath | H03M 1/145 |
| 9,432,036 B1 | 8/2016 | Lowney et al. | |
| 9,654,135 B2* | 5/2017 | Miki | H03M 1/0626 |
| 10,079,609 B2* | 9/2018 | Fan | H03M 1/002 |

* cited by examiner

*Primary Examiner* — Brian K Young
(74) *Attorney, Agent, or Firm* — Robert M. Brush

(57) ABSTRACT

An example capacitive digital-to-analog converter (CDAC) includes: a first plurality of capacitors consisting of M−1 capacitors, where M is an integer greater than one, the first plurality of capacitors including top plates coupled to a first node; a second plurality of capacitors consisting of M−1 capacitors, the second plurality of capacitors including top plates coupled to a second node; a first plurality of switches consisting of M−1 switches coupled to bottom plates of the respective M−1 capacitors of the first plurality of capacitors, the first plurality of switches further coupled to a third node providing a supply voltage and a fourth node providing a ground voltage; a second plurality of switches consisting of M−1 switches coupled to bottom plates of the respective M−1 capacitors of the second plurality of capacitors, the second plurality of switches coupled to the third node and the fourth node; and a control circuit including an input consisting of M bits for receiving an M bit code and an output consisting of 2*(M−1) bits for providing a first M−1 bit code to respectively control the M−1 switches of the first plurality of switches and a second M−1 bit code to respectively control the M−1 switches of the second plurality of switches.

20 Claims, 8 Drawing Sheets

| b2 | b1 | b0 | a1 | a0 | $\overline{a_1}$ | $\overline{a_0}$ |
|---|---|---|---|---|---|---|
| 0 | 0 | 0 | 0 | 0 | 1 | 1 |
| 0 | 0 | 1 | 0 | 1 | 1 | 0 |
| 0 | 1 | 0 | 1 | 0 | 0 | 1 |
| 0 | 1 | 1 | 1 | 1 | 0 | 0 |
| 1 | 0 | 0 | 1 | 1 | 0 | 0 |
| 1 | 0 | 1 | 1 | 0 | 0 | 1 |
| 1 | 1 | 0 | 0 | 1 | 1 | 0 |
| 1 | 1 | 1 | 0 | 0 | 1 | 1 |

600

| b2 | b1 | b0 | ΔVdiff |
|---|---|---|---|
| 0 | 0 | 0 | 0 |
| 0 | 0 | 1 | +(2C/CT)Vref |
| 0 | 1 | 0 | +(4C/CT)Vref |
| 0 | 1 | 1 | +(6C/CT)Vref |
| 1 | 0 | 0 | 0 |
| 1 | 0 | 1 | -(2C/CT)Vref |
| 1 | 1 | 0 | -(4C/CT)Vref |
| 1 | 1 | 1 | -(6C/CT)Vref |

CAPACITIVE DIGITAL-TO-ANALOG CONVERTER

TECHNICAL FIELD

Examples of the present disclosure generally relate to electronic circuits and, in particular, to capacitive digital-to-analog converter (CDAC).

BACKGROUND

Digital-to-analog converters (DACs) convert a digital input into an analog signal. Capacitive DACs (CDACs) perform this task capacitively using a binary-weighted capacitor array. The capacitor array includes a number of capacitors ranging from the largest, responsible for converting the most significant bit (MSB) of data, to the smallest, responsible for converting the least significant bit (LSB) of data. Each capacitor is a separate leg of the array, where the total number of legs is determined by the number of bits in the digital input. Typically, the number of bits of the digital input is determined by the system resolution requirements. For higher-accuracy systems, a larger number of leas are required for the CDAC, leading to a larger capacitor array. Thus, CDACs can have large area requirements, provide increased loading on any connected circuitry, and exhibit increased dynamic power consumption from driving the individual legs. Given that most CDACs are differential in practical applications, these requirements are multiplied by a factor of two. Accordingly, it is desirable to provide a CDAC that satisfies the system resolution requirements, while requiring less implementation area, providing less loading on connected circuitry, and exhibiting less dynamic power consumption.

SUMMARY

In an example, a capacitive digital-to-analog converter (CDAC) includes: a first plurality of capacitors consisting of M−1 capacitors, where M is an integer greater than one, the first plurality of capacitors including top plates coupled to a first node; a second plurality of capacitors consisting of M−1 capacitors, the second plurality of capacitors including top plates coupled to a second node; a first plurality of switches consisting of M−1 switches coupled to bottom plates of the respective M−1 capacitors of the first plurality of capacitors, the first plurality of switches further coupled to a third node providing a supply voltage and a fourth node providing a ground voltage; a second plurality of switches consisting of M−1 switches coupled to bottom plates of the respective M−1 capacitors of the second plurality of capacitors, the second plurality of switches coupled to the third node and the fourth node; and a control circuit including an input consisting of M bits for receiving an M bit code and an output consisting of 2*(M−1) bits for providing a first M−1 bit code to respectively control the M−1 switches of the first plurality of switches and a second M−1 bit code to respectively control the M−1 switches of the second plurality of switches.

In another example, a successive approximate register (SAR) analog-to-digital converter (ADC) includes: a first capacitive digital-to-analog converter (CDAC) coupled between a first node and a second node; a voltage comparator having a first input coupled to the first node and a second input coupled to the second node; SAR logic having an input coupled to an output of the voltage comparator and an output coupled to an input of the first CDAC; and a second CDAC. The second CDAC includes: a first plurality of capacitors consisting of M−1 capacitors, where M is an integer greater than one, the first plurality of capacitors including top plates coupled to the first node; a second plurality of capacitors consisting of M−1 capacitors, the second plurality of capacitors including top plates coupled to the second node; a first plurality of switches consisting of M−1 switches coupled to bottom plates of the respective M−1 capacitors of the first plurality of capacitors, the first plurality of switches further coupled to a third node providing a supply voltage and a fourth node providing a ground voltage; a second plurality of switches consisting of M−1 switches coupled to bottom plates of the respective M−1 capacitors of the second plurality of capacitors, the second plurality of switches coupled to the third node and the fourth node; and a control circuit including an input consisting of M bits for receiving an M bit code and an output consisting of 2*(M−1) bits for providing a first M−1 bit code to respectively control the M−1 switches of the first plurality of switches and a second M−1 bit code to respectively control the M−1 switches of the second plurality of switches.

In another example, a method of digital-to-analog conversion includes: receiving an M-bit code, where M is an integer greater than one; generating, in response to the M-bit code, a first M−1 bit code to control a first plurality of switches consisting of M−1 switches coupled to respective bottom plates of a first plurality of capacitors consisting of M−1 capacitors, top plates of the first plurality of capacitors coupled to a first node, the first plurality of switches switching between a third node providing a supply voltage and a fourth node providing a ground voltage; and generating, in response to the M-bit code, a second M−1 bit code to control a second plurality of switches consisting of M−1 switches coupled to respective bottom plates of a second plurality of capacitors consisting of M−1 capacitors, top plates of the second plurality of capacitors coupled to a second node, the second plurality of switches switching between the third node providing the supply voltage and the fourth node providing the ground voltage.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 6 depicts a truth table illustrating operation of the dither operation in the implementation of the SAR ADC of FIG. 5.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
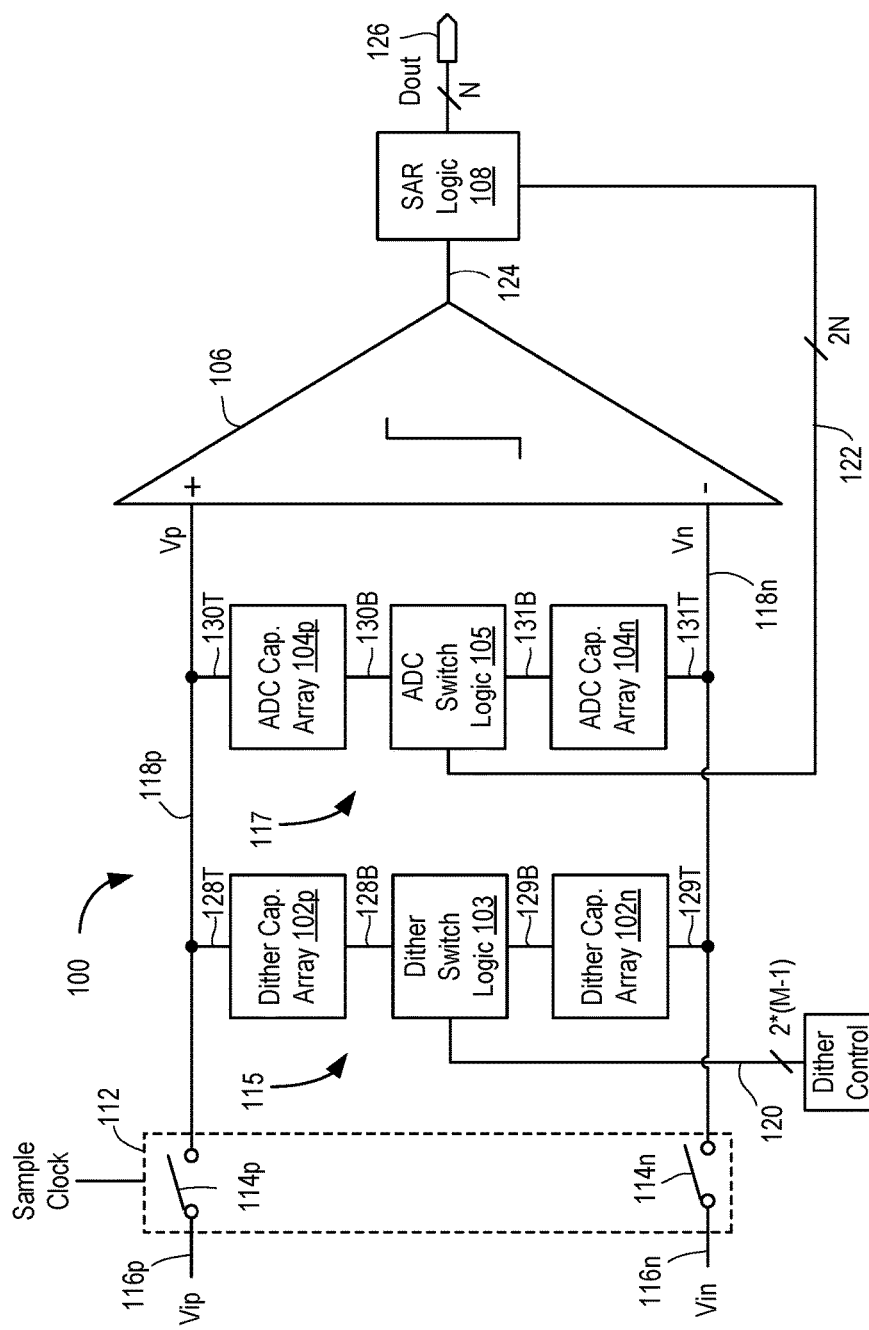
FIG. 1 is a block diagram depicting a successive approximate register (SAR) analog-to-digital converter (ADC) in which an area/energy efficient capacitive digital-to-analog converter (CDAC) described herein can be used according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

A capacitive digital-to-analog converter (CDAC) is described. In an example, the CDAC suitable for high-speed, high-resolution successive approximation register (SAR) analog-to-digital converters (ADCs) is described. The CDAC embeds a most significant bit (MSB) of information into resetting of the CDAC, which enables elimination of one MSB of capacitance without any reduction in resolution. This leads to an area savings of greater than 50%, in addition to reduced dynamic power consumption and loading on any connected circuitry. These and further aspects of the CDAC are described below with respect to the drawings.

FIG. 1 is a block diagram depicting a SAR ADC 100 in which an area/energy efficient CDAC described herein can be used according to an example. The SAR ADC 100 includes a sampler circuit 112, a dither CDAC 115, an ADC CDAC 117, a voltage comparator 106, a SAR circuit ("SAR logic 108"), and dither control circuit ("dither control logic 110"). The SAR ADC 100 includes differential input nodes (116p, 116n) that receive analog voltages Vip and Vin, respectively. A non-inverting input of the voltage comparator 106 is coupled to a node 118p having a voltage Vp. An inverting input of the voltage comparator 106 is coupled to a node 118n having a voltage Vn. The sampler 112 includes a switch 114p and a switch 114n. The switch 114p is coupled between the node 116p and the node 118p. The switch 114n is coupled between the node 116n and the node 118n.

The dither CDAC 115 is a differential CDAC comprising a dither capacitor array ("dither cap. array 102p"), a dither cap. array 102n, and a dither switch circuit ("dither switch logic 103"). Top plates 128T of the dither cap. array 102p are coupled to the node 118p. Top plates 129T of the dither cap. array 102n are coupled to the node 118n. Bottom plates 128B and 129B of the dither cap. array 102p and 102n, respectively, are coupled to the dither switch logic 103.

The ADC CDAC 117 is a differential CDAC comprising an ADC cap. array 104p, an ADC cap. array 102n, and an ADC switch circuit ("ADC switch logic 105"). Top plates 130T of the ADC cap. array 104p are coupled to the node 118p. Top plates 131T of the ADC cap. array 104n are coupled to the node 118n. Bottom plates 130B and 131B of the ADC cap. array 104p and 104n, respectively, are coupled to the ADC switch logic 105.

A node 124 is formed by an output of the voltage comparator 106 and an input of the SAR logic 108. The SAR logic 108 includes an N-bit output (Dout) coupled to an N-bit bus 126, where N is a positive integer. The SAR logic 108 includes another output coupled to a 2N-bit bus 122 (i.e., the bus 122 has twice the width of the bus 126). The bus 122 is coupled to 2N switches in the ADC switch logic 105. The dither control logic 110 includes an output coupled to a bus 120 having a width 2*(M−1), where M is a positive integer greater than one. The bus 120 is coupled to 2*(M−1) switches in the dither switch logic 103. Each ADC cap. array 104p and 104n includes N capacitors. Each dither cap. array 102p and 102n includes M−1 capacitors.

In operation, during each sampling cycle, the switches 114p and 114n are closed, the ADC cap. array 104p stores a first charge proportional to Vip, and the ADC cap. array 104n stores a second charge proportional to Vin. The switches 114p and 114n are then opened. The node 118p has a voltage Vp with respect to a common mode voltage, and the node 118n has a voltage Vn with respect to the common mode voltage. The switches 114p and 114n open and close according to a sample clock.

Each bit of Dout corresponds to a certain difference between Vip and Vin. The bits Dout<N−1:0> correspond to voltage differences $V_{MSB} \ldots V_{LSB}$ between Vip and Vin. Thus, Dout<N−1:0> represents (Vip−Vin)=Dout<N−1>*$V_{MSB}$+Dout<N−2>*$V_{MSB-1}$+ . . . +Dout<0>*$V_{LSB}$, where Dout<i>∈{0,1}∀i∈[0,N−1]. The SAR logic 108 controls the ADC switch logic 105 over N SAR cycles to determine the N bits of Dout. In the first cycle, the SAR logic 108 controls the ADC switch logic 105 to adjust Vp and Vn in a manner that subtracts $V_{MSB}$ from (Vp−Vn). If (Vp−Vn−$V_{MSB}$) is positive, as determined by the voltage comparator 106, Dout<N−1> is set to '1'. If (Vp−Vn−$V_{MSB}$) is negative, as determined by the voltage comparator 106, Dout<N−1> is set to '0'. The SAR logic 108 next controls the ADC switch logic 105 to adjust Vp and Vn in a manner that subtracts Dout<N−1>*$V_{MSB}$+$V_{MSB-1}$ from (Vp−Vn). If the voltage comparator 106 outputs a logic '1', then Dout<N−2> is set to logic '1'; otherwise Dout<N−2> is set to logic '0'. This process is repeated for each bit of Dout down to Dout<0>. For each SAR cycle, the SAR logic 108 provides a first N-bit code to the ADC switch logic 105 to control redistribution of charge in the ADC cap. array 104p, and a second N-bit code to the ADC switch logic 105 to control redistribution of charge in the ADC cap. array 104n.

Various non-idealities limit the accuracy of a SAR ADC (e.g., offset, noise, mismatch, etc.). Capacitor mismatch is a dominant non-ideality that introduces spurious frequencies (spurs) around a carrier signal, hence lowering the dynamic range. These spurs can be reduced by adding noise to the CDAC through a technique known as dither. The effect of dither is to spread the energy of the spurs across the entire frequency spectrum, thereby lowering their level and increasing dynamic range of the carrier signal. Dither can be added to a SAR ADC by randomly adding bits to the CDAC.

As shown in the example of FIG. 1, the dither CDAC 115 adds M dither bits to the N bits of the ADC CDAC 117. Using techniques described further below, the dither CDAC 115 adds M bits of dither using only M−1 dither capacitors in each of the dither cap. array 102$p$ and the dither cap. array 102$n$. For each sampling cycle, the dither control logic 110 supplies a first (M−1) bit code to the dither switch logic 103 to control redistribution of charge in the dither cap. array 102$p$, and a second (M−1) bit code to the dither switch logic 103 to control redistribution of charge in the dither cap. array 102$n$. The dither CDAC 115 omits capacitors associated with the MSB of an M-bit dither code selected by the dither control logic 110. Since the capacitor associated with the MSB is the largest capacitor, this saves area, reduces power consumption, and reduces loading on nodes 118$p$ and 118$n$.

Figure 2:
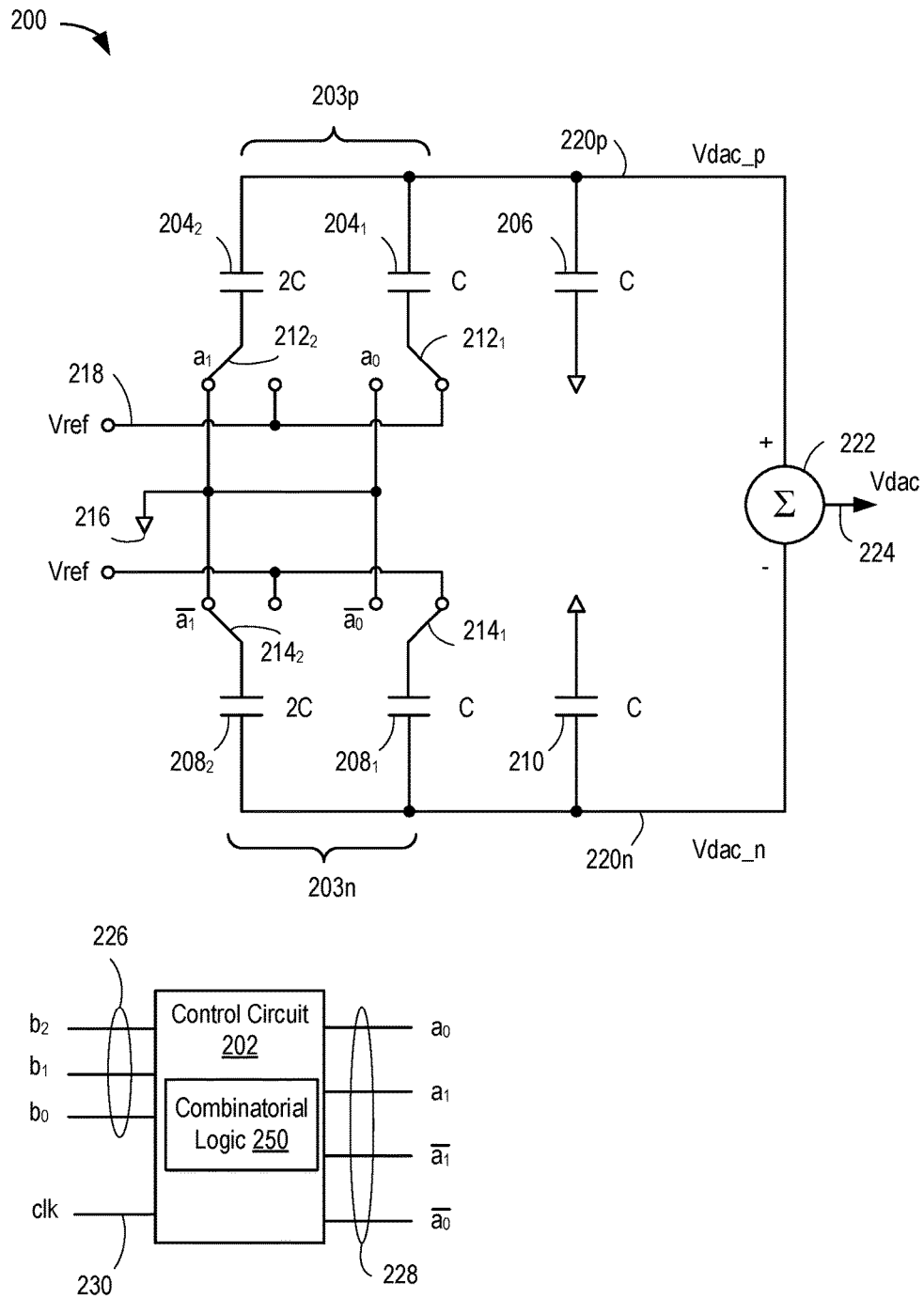
FIG. 2 is a schematic diagram depicting an area/energy efficient CDAC according to an example.

FIG. 2 is a schematic diagram depicting an area/energy efficient CDAC 200 according to an example. The CDAC 200 is a differential CDAC including a cap. array 203$p$, a cap. array 203$n$, a control circuit 202, and a summer circuit ("summer 222"). In general, each cap. array 203$p$ and 203$n$ includes (M−1) capacitors, where M is an integer greater than one. In the example shown, each cap. array 203$p$ and 203$n$ includes two capacitors. The cap. array 203$p$ includes capacitors $204_1$ and $204_2$, and the cap. array 203$n$ includes capacitors $208_1$ and $208_2$. The capacitors in each cap. array 203$p$ and 203$n$ are binary weighted. In the example shown, the capacitor $204_1$ has a capacitance C and the capacitor $204_2$ has a capacitance 2C. Likewise, the capacitor $208_1$ has the capacitance C and the capacitor $208_2$ has a capacitance 2C. Top plates of the capacitors $204_1$ and $204_2$ are coupled to a node 220$p$ having a voltage Vdac_p. Top plates of the capacitors $208_1$ and $208_2$ are coupled to a node 220$n$ having a voltage Vdac_n. A non-inverting input of the summer 222 is coupled to the node 220$p$, and an inverting input of the summer 222 is coupled to the node 220$n$. An output of the summer 222 is coupled to a node 224 having a voltage Vdac.

The CDAC 200 includes a switch coupled to each capacitor therein. In the example show, the CDAC 200 includes switches $212_1$ and $212_2$ coupled to the capacitors $204_1$ and $204_2$, respectively. The CDAC 200 includes switches $214_1$ and $214_2$ coupled to the capacitors $208_1$ and $208_2$, respectively. The switches $212_1$ and $212_2$, $214_1$, and $214_2$ are single-pole, double-throw switches that can switch between a node 218 supplying a voltage Vref and a node 216 supplying a ground voltage. The switches $212_1$ and $212_2$ are controlled by control signals $a_0$ and $a_1$, respectively, generated by the control circuit 202. The switches $214_1$ and $214_2$ are controlled by control signals $\bar{a}_0$ and $\bar{a}_1$, respectively, generated by the control circuit 202 (where the "bar" accent indicates a logical inverse).

The control circuit 202 includes an input 226 and an output 228. In general, the input 226 has a width of M bits, and the output 228 has a width of 2*(M−1) bits. The input 226 receives an M-bit digital code. In the example shown, the input 226 has a width of three bits (i.e., M=3), designated by the code b<2:0>. The output 228 thus has a width 2*(3−1)=4 bits supplying a first two-bit code a<1:0> and a second two-bit code $\bar{a}$<1:0>. The control circuit 202 also includes an input coupled to a node 230 that supplies a clock signal (clk).

In the example shown, the CDAC 200 includes a capacitor 206 coupled between the node 220$p$ and the ground node 216, and a capacitor 210 coupled between the node 220$n$ and the ground node 216. Each of the capacitor 206 and the capacitor 210 has the capacitance C in the example, but each capacitor 206 and 210 can have a different capacitance. In general, the total capacitance coupled to the node 220$p$ equals the total capacitance coupled to the node 220$n$ (e.g., 4C in the example). In other examples, the capacitors 206 and 210 are omitted. In still other examples, the capacitors 206 and 210 are part of another circuit (as described in examples below). In some examples, the summer 222 is also part of another circuit (as described in examples below).

Figures 3, 4:
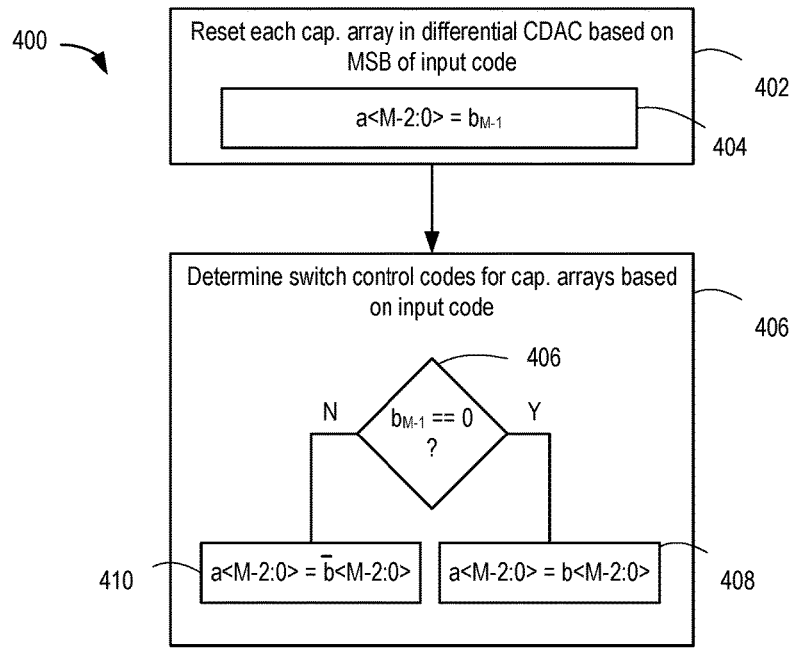
FIG. 3 depicts a truth table illustrating operation of control logic in the CDAC of FIG. 2.
FIG. 4 is a flow diagram depicting operation of the CDAC of FIG. 2 according to an example.

In operation, the CDAC 200 converts the input code b<2:0> into an analog voltage Vdac. A conventional CDAC includes two each of capacitances 4C, 2C, and C corresponding to $b_2$, $b_1$, and $b_0$ bits of b<2:0>. In the area/energy efficient CDAC 200, the capacitors corresponding to $b_2$ (the MSB) are omitted (e.g., the two 4C capacitances present in the conventional CDAC are omitted). The CDAC 200 includes two phases implemented by the control circuit 202. In a reset phase, $a_1$ and $a_0$ are set to $b_2$ (the MSB of the input code). As a result, in the reset phase, $\bar{a}_0$ and $\bar{a}_1$ are set to $\bar{b}_2$. After the reset phase, in the conversion phase: if $b_2$=0, then $a_1$=$b_1$ and $a_0$=$b_0$ when $b_2$=0; otherwise if $b_2$=1, then $a_1$=$\bar{b}_1$ and $a_0$=$\bar{b}_0$. FIG. 3 summarizes a truth table 300 that captures the logic of the conversion phase of the CDAC 200. In an example, the control circuit 202 is an asynchronous circuit comprising combinatorial logic that implements the truth table 300 shown in FIG. 3. Other implementations of the control circuit 202 are possible, such as a lookup table (LUT) implementation.

In this manner, the CDAC 200 eliminates one MSB of capacitance from a differential CDAC without any reduction in resolution. Given than one MSB of capacitance accounts for half of the total capacitance in the array, the CDAC 200 saves area with respect to a conventional CDAC, in addition to reducing loading and dynamic power consumption. The CDAC 200 can be used as a clock CDAC in a SAR ADC. For such a CDAC, its capacitors must be reset after each input sample has been processed. Conventionally, this is achieved by resetting each capacitor to a fixed reference voltage. The CDAC 200 instead resets to the MSB of the next sample. This embeds one MSB of information into the resetting of the capacitor array, thereby eliminating the need for one MSB of explicit capacitance. When the sample is read in, the sample is not directly applied to the cap. array. Rather, the MSB of the sample is first used to reset the cap. array, during which time the control circuit 202 determines where to assign the remaining bits once the array transitions from the reset phase to the conversion phase.

FIG. 4 is a flow diagram depicting operation of the CDAC 200 according to an example. The method 400 begins at step 402, where the control circuit 202 resets each cap. array 203$p$ and 203$n$ based on the MSB of the input code b<M−1:0> (i.e., $b_{M-1}$). In particular, at step 404, the control circuit 202 sets a<M−2:0> to $b_{M-1}$. Accordingly, the complement of a<M−2:0> is set to the complement of $b_{M-1}$. At step 406, the control circuit 202 determines switch control codes for the cap. arrays 203$p$ and 203$n$ based on the input code. In particular, at step 406, the control circuit 202 determines whether the MSB of b<M−1:0> is equal to logic 0. If so, the method 400 proceeds to step 408, where the control circuit 202 sets a<M−2:0> to b<M−2:0>. If the MSB of b<M−1:0> is equal to logic 1, then the method 400 proceeds to step 410, where the control circuit 202 sets a<M−2:0> to $\bar{b}$<M−2:0>.

Figure 5:
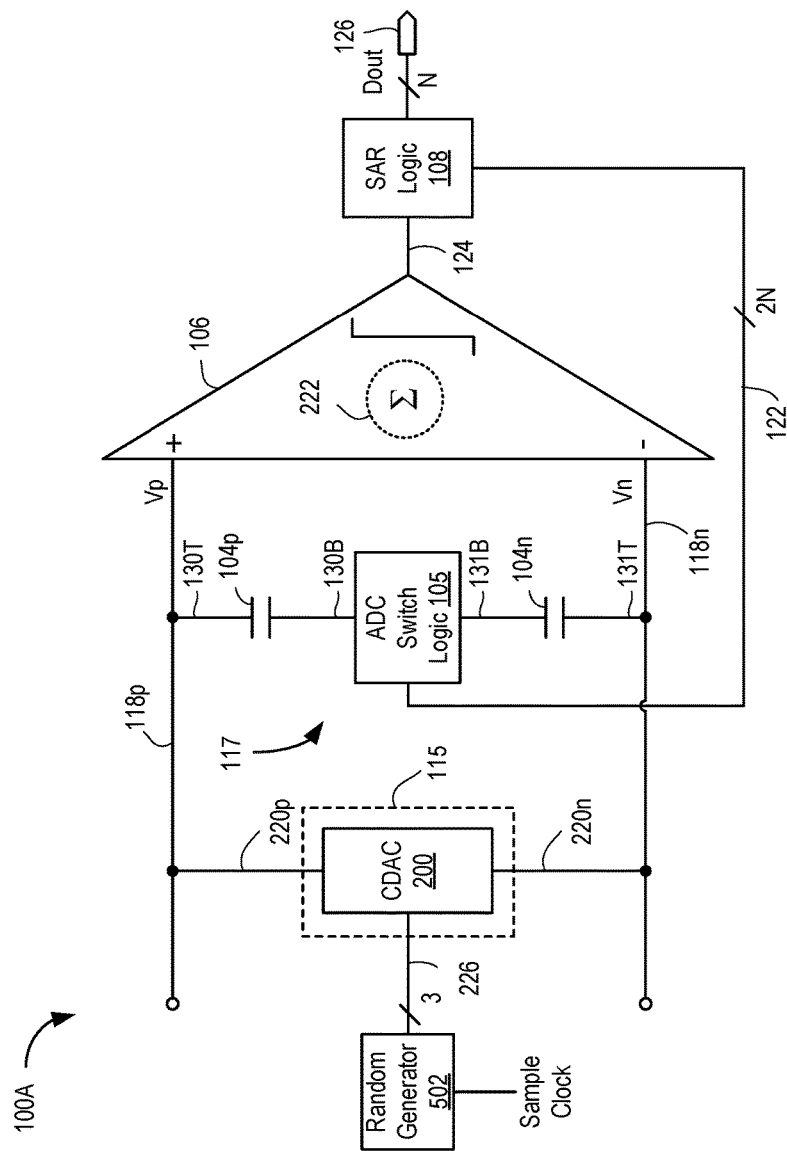
FIG. 5 is a block diagram depicting an implementation of the SAR ADC of FIG. 1 having the CDAC shown in FIG. 2 according to an example.

FIG. 5 is a block diagram depicting an implementation 100A of the SAR ADC 100 shown in FIG. 1 having the CDAC 200 according to an example. In the example, the CDAC 200 implements the dither CDAC 115. The node 220$p$ of the CDAC 200 is coupled to the node 118$p$, and node 220$n$ of the CDAC 200 is coupled to the node 118$n$. The control logic 110 is distributed between a random generator 502 and the control circuit 202 of the CDAC 200.

The random generator 502 is coupled to the input 226 of the control circuit 202 to supply the code b<2:0>. The random generator 502 supplies a different code b<2:0> for each sample cycle of the SAR ADC 100. The summer 222 of the CDAC 200 is implemented by the voltage comparator 106. The capacitor 206 shown in FIG. 3 is implemented by the capacitance of the ADC cap. array 104$p$. The capacitor 210 shown in FIG. 3 is implemented by the capacitance of the ADC cap. array 104$n$. Thus, the CDAC 200 includes the capacitors $204_1$, $204_2$, $208_1$, and $208_2$, as shown in FIG. 3.

FIG. 6 depicts a truth table 600 illustrating operation of the dither operation in the implementation 100A of the SAR ADC 100. The random generator 502 outputs a random code b<2:0> for each sampling cycle. In the reset phase, when sampling Vip and Vin, the control circuit 202 resets the cap. array 203$p$ and the cap. array 203$n$ based on $b_2$ of the next code b<2:0> output by the random generator 502. Charge is distributed between the capacitors in the ADC cap. array 104$p$ and the capacitors in the cap. array 203$p$ of the CDAC 200 so that the voltage Vp reaches Vip. Likewise, charge is distributed between the capacitors in the ADC cap. array 104$n$ and the capacitors in the cap. array 203$n$ of the CDAC 200 so that the voltage Vn reaches Vin. After sampling Vip and Vin, the control circuit 202 enters the conversion phase, where the switches $212_1$, $212_2$, $214_1$, and $214_2$ are set based on the input code b<2:0>, as shown in the truth table 300 of FIG. 3. The table 600 shows the amount of dither added to the output of the voltage comparator 106 for each code b<2:0> supplied by the random generator 502. For the code 000, ΔVdiff is 0. For the code 001, ΔVdiff is +(2C/CT)Vref, where CT is the total capacitance coupled to the node 118$p$ (which is equal to the total capacitance coupled to the node 118$n$). For the codes 010 and 011, ΔVdiff is +(4C/CT)Vref and +(6C/CT)Vref, respectively. For the code 100, ΔVdiff is 0. For the codes 101, 110, and 111, ΔVdiff is –(2C/CT)Vref, –(4C/CT)Vref, and –(6C/CT)Vref, respectively. Thus, the CDAC 200 can apply 3-bits of dither using only four capacitors (as opposed to six capacitors). In other examples, the CDAC 200 can have more resolution than two bits to provide more resolution for the dither operation.

Figure 7:
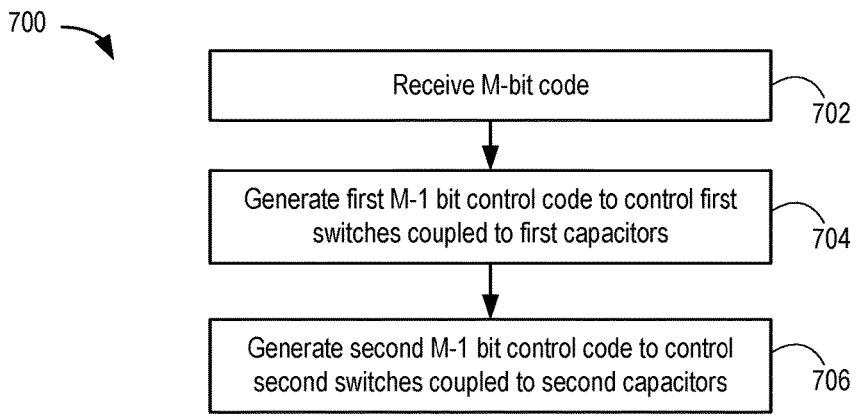
FIG. 7 is a flow diagram depicting a method of digital-to-analog conversion according to an example.

FIG. 7 is a flow diagram depicting a method 700 of digital-to-analog conversion according to an example. The method 700 is performed by the control circuit 202 controlling the CDAC 200. The method 700 begins at step 702, where the control circuit 202 receives the M-bit code. At step 704, the control circuit 202 generates a first M–1 bit code to control first switches ($212_1$ and $212_2$) coupled to first capacitors ($204_1$ and $204_2$). At step 706, the control circuit 202 generates a second M–1 bit code to control second switches ($214_1$ and $214_2$) coupled to second capacitors ($208_1$ and $208_2$). The CDAC 200 operates as described above. The method 700 can be repeated for different M-bit codes.

Figure 8:
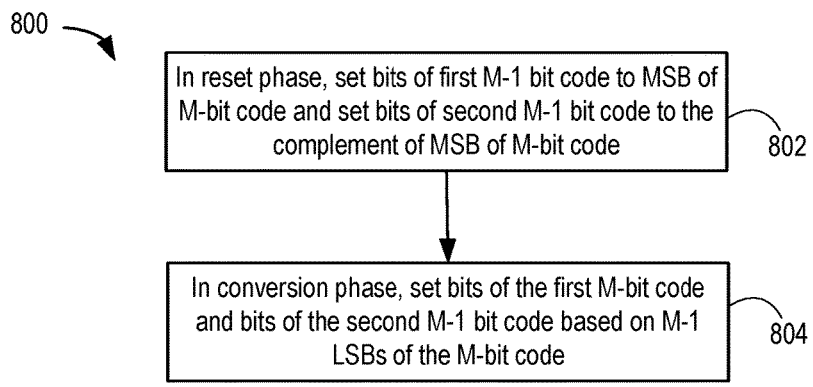
FIG. 8 is a flow diagram depicting a method of setting the first and second M−1 bit control codes based on a given M bit input code according to an example.

FIG. 8 is a flow diagram depicting a method 800 of setting the first and second M–1 bit control codes based on a given M bit input code according to an example. The method 800 is performed by the control circuit 202 controlling the CDAC 200. At step 802, in the reset phase, the control circuit 202 sets bits of the first M–1 bit code to the MSB of the M-bit code and sets bits of the second M–1 bit code to the complement of the MSB of the M-bit code. This embeds one MSB of data into the reset of the CDAC 200. At step 804, in the conversion phase, the control circuit 202 sets bits of the first M–1 bit code and bits of the second M–1 bit code based on M–1 LSBs of the M-bit code, as described above and shown in the truth table of FIG. 3

Figure 9:
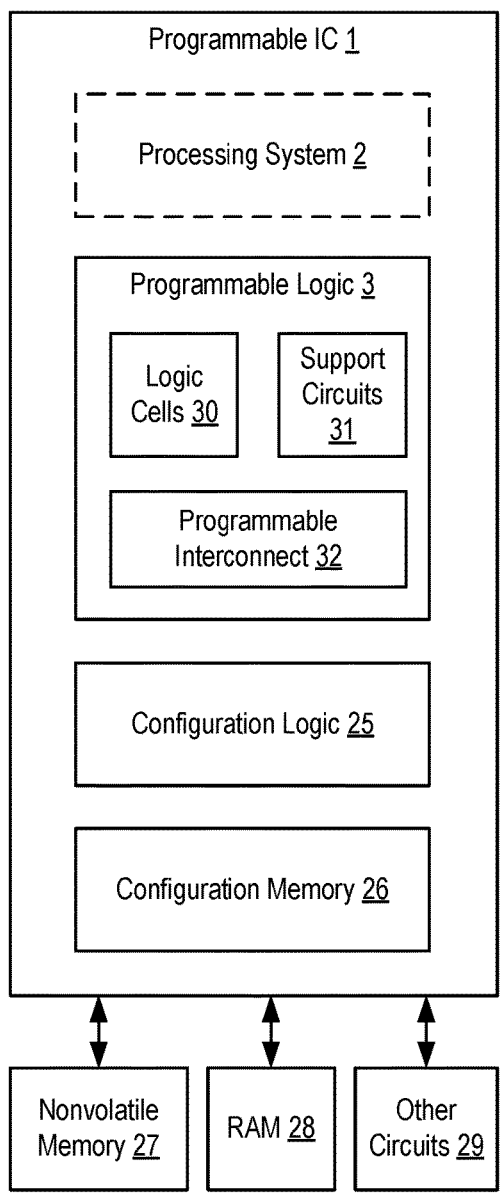
FIG. 9 is a block diagram depicting a programmable integrated circuit (IC) according to an example in which a CDAC as described herein can be used.

FIG. 9 is a block diagram depicting a programmable IC 1 according to an example in which the CDAC 200 described herein can be used. The programmable IC 1 includes programmable logic 3, configuration logic 25, and configuration memory 26. The programmable IC 1 can be coupled to external circuits, such as nonvolatile memory 27, DRAM 28, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the programmable IC 1 includes a processing system 2. The processing system 2 can include microprocessor(s), memory, support circuits, IO circuits, and the like. The support circuits 31 can include one or more instances of the CDAC 200 described above, e.g., as used in one or more SAR ADC circuits.

Figure 10:
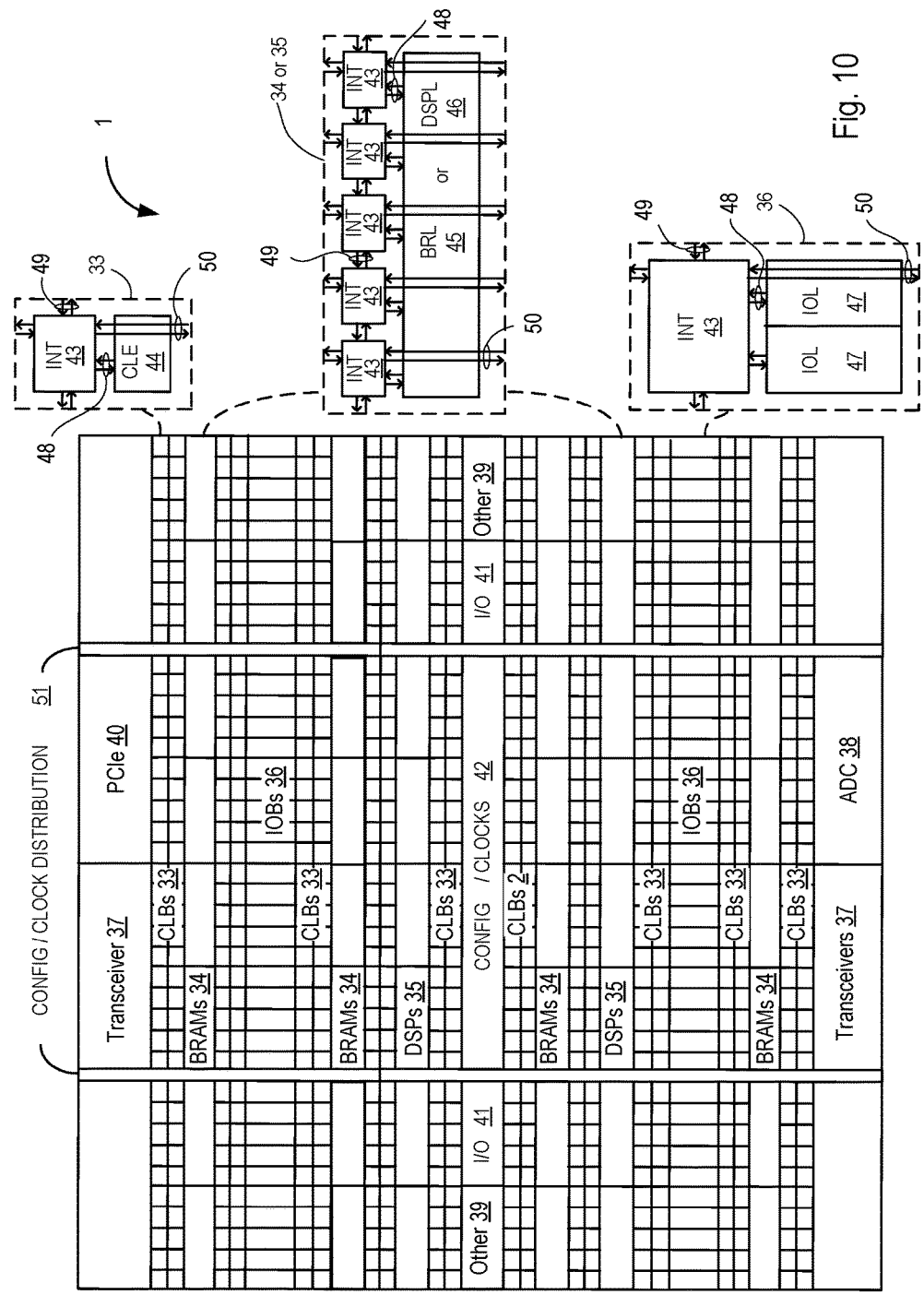
FIG. 10 illustrates a field programmable gate array (FPGA) implementation of the programmable IC of FIG. 9.

FIG. 10 illustrates a field programmable gate array (FPGA) implementation of the programmable IC 1 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The FPGA can also include PCIe interfaces 40, analog-to-digital converters (ADC) 38, and the like. The CDAC 200 can be used in one or more instances of the ADCs 38.

In some FPGAs, each programmable tile can include at least one programmable interconnect element ("INT") 43 having connections to input and output terminals 48 of a programmable logic element within the same tile, as shown by examples included at the top of FIG. 10. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An 10B 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 10) is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 10 include additional logic blocks that disrupt the regular columnar structure making up a large part of the FPGA. The additional logic blocks can be programmable blocks and/or dedicated logic. Note that FIG. 10 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 10 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A capacitive digital-to-analog converter (CDAC), comprising:
    a first plurality of capacitors consisting of M−1 capacitors, where M is an integer greater than one, the first plurality of capacitors including top plates coupled to a first node;
    a second plurality of capacitors consisting of M−1 capacitors, the second plurality of capacitors including top plates coupled to a second node;
    a first plurality of switches consisting of M−1 switches coupled to bottom plates of the respective M−1 capacitors of the first plurality of capacitors, the first plurality of switches further coupled to a third node providing a supply voltage and a fourth node providing a ground voltage;
    a second plurality of switches consisting of M−1 switches coupled to bottom plates of the respective M−1 capacitors of the second plurality of capacitors, the second plurality of switches coupled to the third node and the fourth node; and
    a control circuit including an input consisting of M bits for receiving an M bit code and an output consisting of 2*(M−1) bits for providing a first M−1 bit code to respectively control the M−1 switches of the first plurality of switches and a second M−1 bit code to respectively control the M−1 switches of the second plurality of switches.

2. The CDAC of claim 1, further comprising:
    a summer circuit coupled to the first node and the second node.

3. The CDAC of claim 1, further comprising:
    a first capacitor coupled between the first node and the fourth node; and
    a second capacitor coupled between the second node and the fourth node.

4. The CDAC of claim 1, wherein the control circuit is configured to:
    in a reset phase, set the bits of the first M−1 bit code to a most significant bit (MSB) of the M-bit code and set the bits of the second M−1 bit code to the logical complement of the MSB of the M-bit code; and
    in a conversion phase, set the bits of the first M−1 bit code to: the M−1 least significant bits (LSBs) of the M-bit code when the MSB of the M-bit code is a logical zero, and the logical complement of the M−1 LSBs of the M-bit code when the MSB of the M-bit code is a logical one; and
    in the conversion phase, set the bits of the second M−1 bit code to: the logical complement of the M−1 LSBs of the M-bit code when the MSB of the M-bit code is a logical zero, and the M−1 LSBs of the M-bit code when the MSB of the M-bit code is a logical one.

5. The CDAC of claim 1, wherein the M−1 capacitors of the first plurality of capacitors, and the M−1 capacitors of the second plurality of capacitors, are each binary-weighted.

6. The CDAC of claim 1, wherein the control circuit includes combinatorial logic configured to generate the first M−1 bit code and the second M−1 bit code from the M-bit code.

7. The CDAC of claim 6, wherein the second M−1 bit code is the logical inverse of the first M−1 bit code.

8. A successive approximate register (SAR) analog-to-digital converter (ADC), comprising:
    a first capacitive digital-to-analog converter (CDAC) coupled between a first node and a second node;
    a voltage comparator having a first input coupled to the first node and a second input coupled to the second node;
    SAR logic having an input coupled to an output of the voltage comparator and an output coupled to an input of the first CDAC; and
    a second CDAC, comprising:
        a first plurality of capacitors consisting of M−1 capacitors, where M is an integer greater than one, the first plurality of capacitors including top plates coupled to the first node;
        a second plurality of capacitors consisting of M−1 capacitors, the second plurality of capacitors including top plates coupled to the second node;
        a first plurality of switches consisting of M−1 switches coupled to bottom plates of the respective M−1 capacitors of the first plurality of capacitors, the first plurality of switches further coupled to a third node providing a supply voltage and a fourth node providing a ground voltage;
        a second plurality of switches consisting of M−1 switches coupled to bottom plates of the respective M−1 capacitors of the second plurality of capacitors, the second plurality of switches coupled to the third node and the fourth node; and
        a control circuit including an input consisting of M bits for receiving an M bit code and an output consisting of 2*(M−1) bits for providing a first M−1 bit code to respectively control the M−1 switches of the first plurality of switches and a second M−1 bit code to respectively control the M−1 switches of the second plurality of switches.

9. The SAR ADC of claim 8, further comprising:
a random generator configured to supply the M-bit code to the control circuit of the second CDAC.

10. The SAR ADC of claim 8, wherein the control circuit is configured to:
in a reset phase, set the bits of the first M−1 bit code to a most significant bit (MSB) of the M-bit code and set the bits of the second M−1 bit code to the logical complement of the MSB of the M-bit code; and
in a conversion phase, set the bits of the first M−1 bit code to: the M−1 least significant bits (LSBs) of the M-bit code when the MSB of the M-bit code is a logical zero, and the logical complement of the M−1 LSBs of the M-bit code when the MSB of the M-bit code is a logical one; and
in the conversion phase, set the bits of the second M−1 bit code to: the logical complement of the M−1 LSBs of the M-bit code when the MSB of the M-bit code is a logical zero, and the M−1 LSBs of the M-bit code when the MSB of the M-bit code is a logical one.

11. The SAR ADC of claim 8, wherein the M−1 capacitors of the first plurality of capacitors, and the M−1 capacitors of the second plurality of capacitors, are each binary-weighted.

12. The SAR ADC of claim 8, wherein the control circuit includes combinatorial logic configured to generate the first M−1 bit code and the second M−1 bit code from the M-bit code.

13. The SAR ADC of claim 12, wherein the second M−1 bit code is the logical inverse of the first M−1 bit code.

14. The SAR ADC of claim 8, further comprising a sampling circuit coupled to the first node and the second node.

15. The SAR ADC of claim 8, further comprising:
a first capacitor coupled between the first node and the fourth node; and
a second capacitor coupled between the second node and the fourth node.

16. The SAR ADC of claim 8, further comprising:
a summer circuit coupled to the first node and the second node.

17. A method of digital-to-analog conversion, comprising:
receiving an M-bit code, where M is an integer greater than one;
generating, in response to the M-bit code, a first M−1 bit code to control a first plurality of switches consisting of M−1 switches coupled to respective bottom plates of a first plurality of capacitors consisting of M−1 capacitors, top plates of the first plurality of capacitors coupled to a first node, the first plurality of switches switching between a third node providing a supply voltage and a fourth node providing a ground voltage; and
generating, in response to the M-bit code, a second M−1 bit code to control a second plurality of switches consisting of M−1 switches coupled to respective bottom plates of a second plurality of capacitors consisting of M−1 capacitors, top plates of the second plurality of capacitors coupled to a second node, the second plurality of switches switching between the third node providing the supply voltage and the fourth node providing the ground voltage.

18. The method of claim 17, further comprising:
in a reset phase, setting the bits of the first M−1 bit code to a most significant bit (MSB) of the M-bit code and set the bits of the second M−1 bit code to the logical complement of the MSB of the M-bit code; and
in a conversion phase, setting the bits of the first M−1 bit code to: the M−1 least significant bits (LSBs) of the M-bit code when the MSB of the M-bit code is a logical zero, and the logical complement of the M−1 LSBs of the M-bit code when the MSB of the M-bit code is a logical one; and
in the conversion phase, setting the bits of the second M−1 bit code to: the logical complement of the M−1 LSBs of the M-bit code when the MSB of the M-bit code is a logical zero, and the M−1 LSBs of the M-bit code when the MSB of the M-bit code is a logical one.

19. The method of claim 17, wherein the M−1 capacitors of the first plurality of capacitors, and the M−1 capacitors of the second plurality of capacitors, are each binary-weighted.

20. The method of claim 17, wherein the second M−1 bit code is the logical inverse of the first M−1 bit code.

* * * * *